United States Patent
Wheat et al.

(10) Patent No.: US 6,863,925 B1
(45) Date of Patent: Mar. 8, 2005

(54) METHOD FOR VAPOR PHASE ALUMINIDING INCLUDING A MODIFYING ELEMENT

(75) Inventors: Gary Eugene Wheat, Madisonville, KY (US); Terri Kay Brown, Central City, KY (US); Roger Dale Wustman, Loveland, OH (US); Joseph David Rigney, Milford, OH (US)

(73) Assignee: General Electric Company, Schenectady, NY (US)

( * ) Notice: Subject to any disclaimer, the term of this patent is extended or adjusted under 35 U.S.C. 154(b) by 247 days.

(21) Appl. No.: 09/670,189

(22) Filed: Sep. 26, 2000

(51) Int. Cl.[7] .............................................. C23C 16/08
(52) U.S. Cl. ...................... 427/250; 427/252; 427/253; 427/226
(58) Field of Search ............................... 427/226, 250, 427/252, 253

(56) References Cited

U.S. PATENT DOCUMENTS

| | | | | |
|---|---|---|---|---|
| 3,764,373 A | * | 10/1973 | Speirs et al. ................. | 427/253 |
| 3,951,642 A | * | 4/1976 | Chang et al. ................. | 75/255 |
| 4,066,806 A | * | 1/1978 | Speirs et al. ................. | 427/253 |
| 4,142,023 A | * | 2/1979 | Bornstein et al. ........... | 428/680 |
| 4,180,400 A | * | 12/1979 | Smith et al. .................. | 75/235 |
| 4,655,040 A | * | 4/1987 | Parker ......................... | 60/602 |
| 4,901,669 A | * | 2/1990 | Yamamoto et al. ... | 118/723 ER |
| 5,261,963 A | * | 11/1993 | Basta et al. ................. | 118/724 |
| 5,658,614 A | * | 8/1997 | Basta et al. ................. | 427/142 |
| 5,989,733 A | * | 11/1999 | Warnes et al. .............. | 428/652 |

* cited by examiner

*Primary Examiner*—Michael Cleveland
(74) *Attorney, Agent, or Firm*—McNees Wallace & Nurick LLC

(57) ABSTRACT

An article is coasted by preparing a coating source having an aluminum halide, a fluoride or an iodide of a modifying element as a source of the modifying element, and a carrier gas. The modifying element is zirconium, hafnium, and yttrium, or combinations thereof. The coating source is contacted to the article, and the coating source and the article are heated to a coating temperature of at least about 1850° F. for a period of time sufficient to permit aluminum and the modifying element to coat onto the surface of the article. The preferred fluorides of modifying elements are zirconium tetrafluoride and hafnium tetrafluoride.

20 Claims, 3 Drawing Sheets

METHOD FOR VAPOR PHASE ALUMINIDING INCLUDING A MODIFYING ELEMENT

FIELD OF THE INVENTION

This invention relates to the coating of substrates with a modified aluminum-containing coating, and, more particularly, to vapor phase aluminiding with an added modifying element.

BACKGROUND OF THE INVENTION

In an aircraft gas turbine (jet) engine, air is drawn into the front of the engine, compressed by a shaft-mounted compressor, and mixed with fuel. The mixture is burned, and the hot combustion gases are passed through a turbine mounted on the same shaft. The flow of combustion gas turns the turbine by impingement against an airfoil section of the turbine blades and vanes, which turns the shaft and provides power to the compressor. The hot exhaust gases flow from the back of the engine, driving it and the aircraft forwardly.

The hotter the combustion and exhaust gases, the more efficient is the operation of the jet engine. There is thus an incentive to raise the combustion and exhaust gas temperatures. The maximum temperature of the combustion gases is normally limited by the materials used to fabricate the airfoils of the turbine vanes and turbine blades, upon which the hot combustion gases impinge. In current engines, the turbine vanes and blades are made of nickel-based superalloys, and can operate at temperatures of up to about 1800–2100° F.

Many approaches have been used to increase the operating temperature limit of the turbine blades and vanes to their current levels. For example, the composition and processing of the base materials themselves have been improved. Solidification is controlled to produce directionally oriented structures that orient the grain boundaries parallel to the major stress axis or eliminate the grain boundaries entirely, and also take advantage of the most suitable crystallographic orientations of the metal. Physical cooling techniques are used, such as providing internal cooling passages through which cooling air is passed.

In another approach, protective coatings are applied to the internal and external surfaces of the airfoils of the turbine blades and vanes. Aluminide diffusion coatings are used for the internal surfaces, and aluminide diffusion coatings or overlay coatings are used on the external surfaces. A ceramic thermal barrier coating layer may also overlie the aluminum-containing coating on the external surfaces.

Although these internal and external protective layers provide improved resistance to environmental damage of the turbine components and the ability to operate at higher temperatures, there is an opportunity for improvement. Thus, there is a need for improved protective coating systems and methods for their application that extend the capabilities of the turbine components even further. The present invention fulfills this need, and further provides related advantages.

BRIEF SUMMARY OF THE INVENTION

The present invention provides a method for coating an article with an aluminide coating that is modified with at least one other element to enhance oxidation resistance and other environmental performance of the coating. The method may be used on a wide variety of articles, with the airfoils of gas turbine blades and vanes being of particular interest. The coating method uses known procedures, modified to permit the deposition of the modifying element. The amount of the modifying element introduced into the coating may be controlled through the deposition parameters. The approach is compatible with other techniques for improving aluminide coatings, such as platinum aluminiding, and with the subsequent application of an overlying ceramic thermal barrier coating.

A method for coating an article comprises the steps of providing the article having a surface, and preparing a coating source comprising an aluminum halide, a fluoride or an iodide of a modifying element as a source of the modifying element, and a carrier gas. The modifying element is selected from the group consisting of zirconium, hafnium, and yttrium, and mixtures thereof, with zirconium and hafnium preferred. The method further includes contacting the coating source to the article, and heating the coating source and the article to a coating temperature of at least about 1850° F., preferably from about 1850° F. to about 2000° F., for a period of time sufficient to permit aluminum and the modifying element to coat onto the surface of the article to produce a modified aluminide coating. The article may have a layer of platinum or other noble metal applied thereto prior to the contacting step, resulting in a modified platinum aluminide coating. Thus, zirconium-modified diffusion aluminides, zirconium-modified platinum aluminides, hafnium-modified diffusion aluminides, and hafnium-modified platinum aluminides are of particular interest.

The presence of the modifying element improves the oxidation and corrosion resistance of the aluminide layer. The amount of the modifying element in the coating is controllable through the ratio of the aluminum halide to the fluoride of the modifying element. For example, in the case of the zirconium modifying element, the zirconium content of the aluminide coating may be controlled over the range of tenths of a percent up to about 6 percent by weight.

In one embodiment, the article is an airfoil of a gas turbine blade or gas turbine vane, and the article is made of a nickel-base superalloy. The aluminum halide is preferably aluminum trifluoride, and the coating source may further include the elemental form of solid aluminum. The coating source may also include the elemental form of the solid modifying element. In each case, the "elemental" form where present is the pure element or an alloy thereof.

The fluoride of the modifying element is preferred over the iodide. The fluoride of the modifying element is a solid at room temperature. The fluoride of the modifying element may be provided separated from the article surface, such as in a powder form. It may instead or also be provided as a component of a slurry, paint, or the like applied to the surface of the article before the heating step. In either case, the fluoride of the modifying element decomposes upon heating and is reduced to the elemental form by the aluminum. The elemental form of the modifying element then codeposits with the aluminum on the article surface and diffuses into the surface.

The fluoride (or an iodide) of the modifying element must be the source of the modifying element. (The elemental form of the modifying element may optionally be present as well, but it may not replace the fluoride of the modifying element.) The present approach has been found to be operable and most practical where the modifying element is supplied from its fluoride, although in some cases the iodide of the modifying element may be operable as well. The chlorides and bromides of the modifying element are not within the scope of the present invention, as they are not thermodynamically and kinetically suitable.

The present approach is operable to deposit a modified aluminide coating onto the surface of the article by the described modified vapor phase aluminiding process. The modified vapor phase aluminiding approach is preferably to alternative candidates for introducing the modifying element into the aluminide coating, because it is less labor intensive and consequently less expensive.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
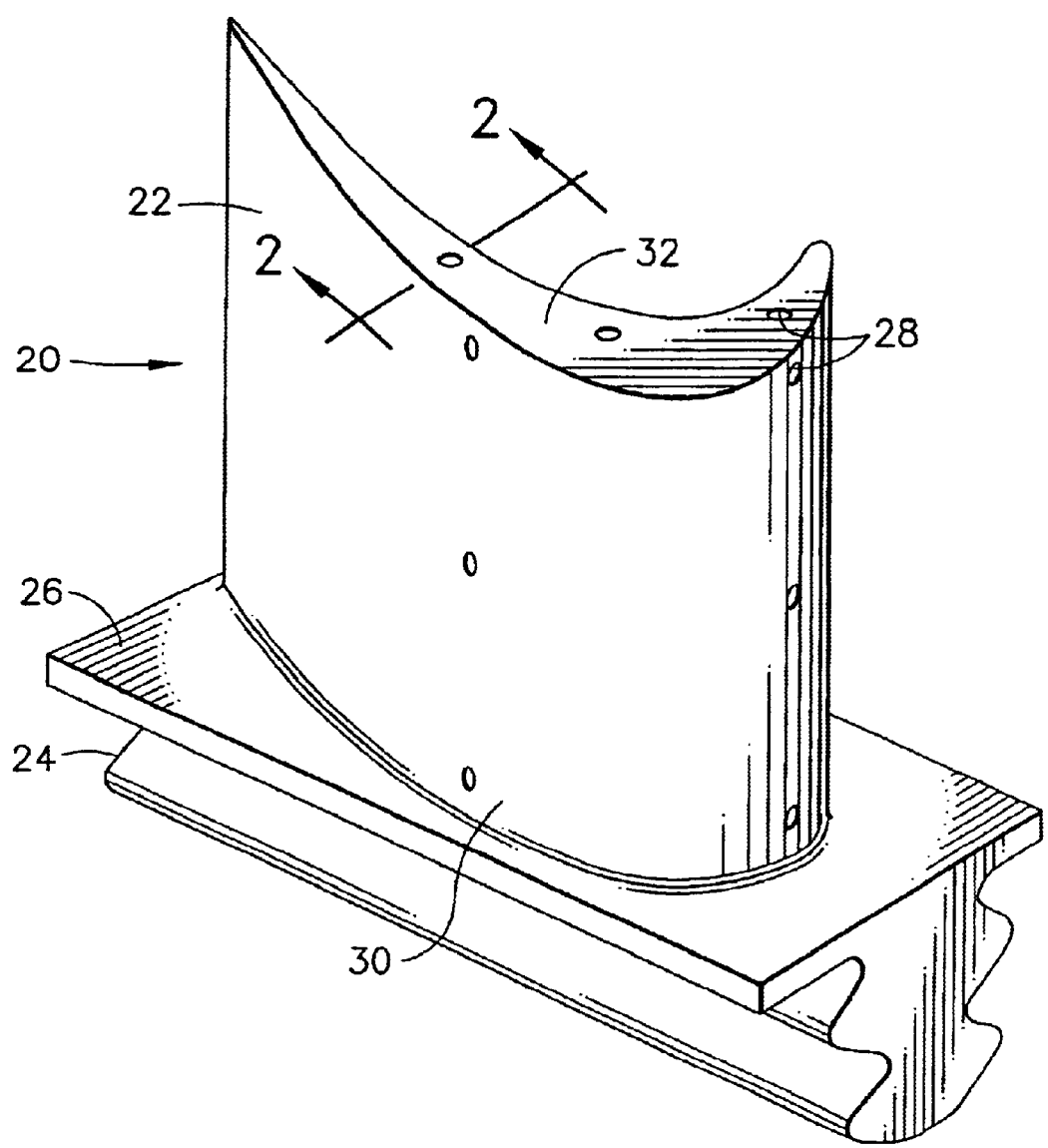
FIG. 1 is a perspective view of a turbine blade.

FIG. 1 depicts a component article of a gas turbine engine such as a turbine blade or turbine vane, and in this illustration a turbine blade 20. The turbine blade 20 is formed of any operable material, but is preferably a nickel-base superalloy. The turbine blade 20 includes an airfoil 22 against which the flow of hot combustion gas is directed. (The turbine vane has a similar appearance in respect to the pertinent portions.) The turbine blade 20 is mounted to a turbine disk (not shown) by a dovetail 24 which extends downwardly from the airfoil 22 and engages a slot on the turbine disk. A platform 26 extends longitudinally outwardly from the area where the airfoil 22 is integral with the dovetail 24. A number of internal passages optionally extend through the interior of the airfoil 22, ending in openings 28 in the surface of the airfoil 22. A flow of cooling air is directed through the internal passages, to reduce the temperature of the airfoil 22. The airfoil 22 may be described as having a root end 30 adjacent to the dovetail 24, and an oppositely disposed tip end 32 remote from the dovetail 24.

Figure 2:
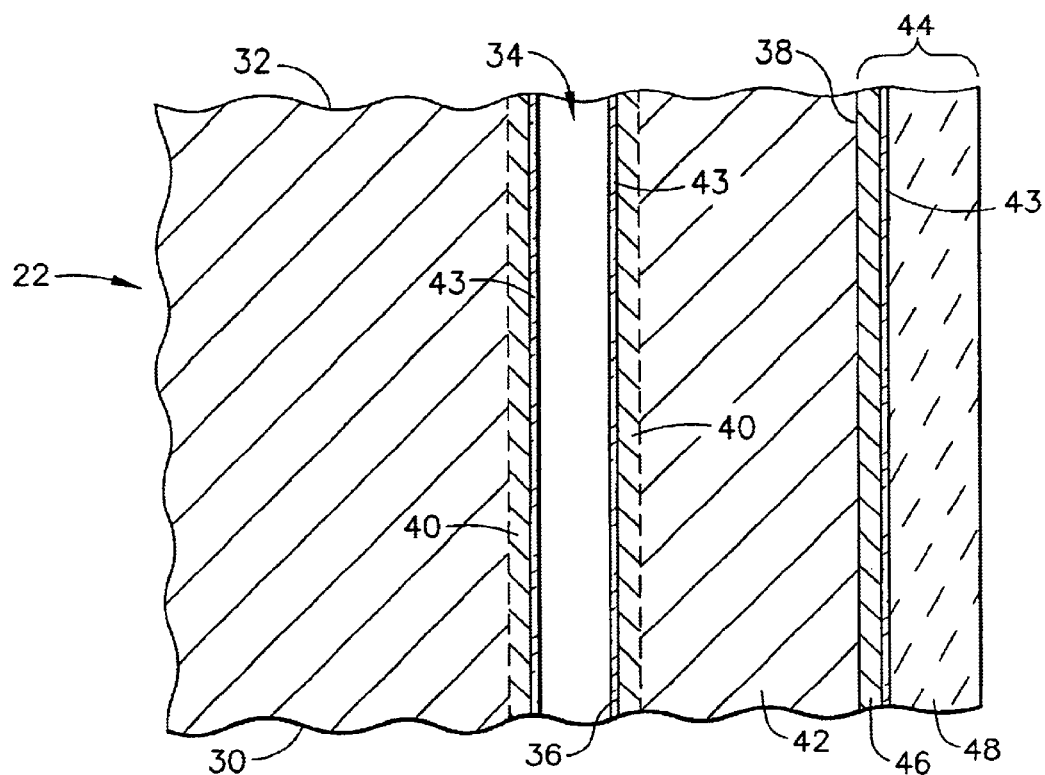
FIG. 2 is an enlarged schematic sectional view through the turbine blade of FIG. 1, taken on lines 2—2.

FIG. 2 is a longitudinal section through the airfoil 22, showing one of the internal passages 34 extending through the interior of the airfoil 22. The internal passage 34 has an internal airfoil surface 36, and there is also an external airfoil surface 38 of the metallic portion of the airfoil 22. The airfoil surfaces 36 and/or 38 may optionally have a thin layer of platinum thereon, preferably deposited by electroplating.

The present approach may be used to deposit an internal protective layer 40 onto the internal airfoil surface 36, an external protective layer 46 onto the external airfoil surface 38, or both. The protective layers 40 and 46 are preferably from about 0.001 inch to about 0.003 inch thick, although they may be thicker or thinner. The protective layers 40 and 46 are formed by depositing a coating comprising aluminum and a modifying element onto the respective internal airfoil surface 36 or external airfoil surface 38, or both, so that a body of the airfoil 22 serves as a substrate 42. The coating is interdiffused with the alloy of the substrate 42. During this processing, a separate step, and/or service of the component article at elevated temperature, the protective layers 40 and 46 are oxidized to form a protective aluminum oxide layer 43, sometimes termed a "scale". This protective aluminum oxide layer inhibits and slows subsequent corrosion and oxidation damage at the airfoil surfaces 36 and 38.

A ceramic thermal barrier coating 48 is optionally deposited overlying and contacting the external protective layer 46 (or aluminum oxide layer 43, if present). When the ceramic thermal barrier coating 48 is present, the protective layer 46 is known as a bond coat, and the protective layer 46 (and its aluminum oxide layer 43) and ceramic thermal barrier coating 48 are collectively termed a thermal barrier coating system 44. The ceramic thermal barrier coating 48 is preferably from about 0.003 to about 0.010 inch thick, most preferably about 0.005 inch thick. (FIG. 2 is not drawn to scale.) The ceramic thermal barrier coating 48 is preferably yttria-stabilized zirconia, which is zirconium oxide containing from about 2 to about 12 weight percent, preferably from about 4 to about 8 weight percent, of yttrium oxide. Other operable ceramic materials may be used as well. It may be deposited by any operable technique, such as physical vapor deposition or plasma spray.

Figure 3:
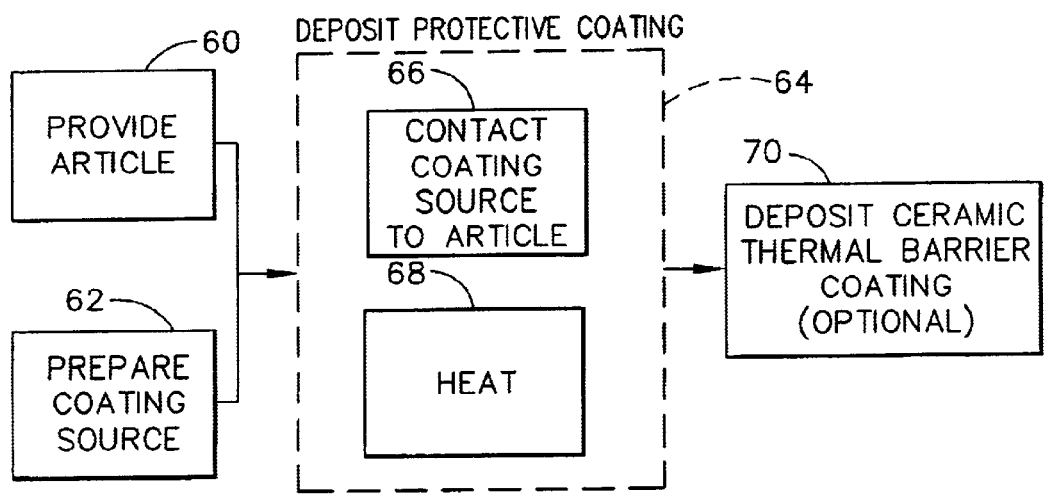
FIG. 3 is a block flow diagram of an approach for preparing a coated gas turbine airfoil.

FIG. 3 is a block flow diagram of a preferred approach for practicing the invention. The article, in this case the airfoil 22, is provided, numeral 60. The turbine blade 20 and its airfoil 22 are preferably made of a nickel-base superalloy. A typical nickel-base alloy has a composition, in weight percent, of from about 1 to about 25 percent cobalt, from about 1 to about 25 percent chromium, from about 0 to about 8 percent aluminum, from 0 to about 10 percent molybdenum, from about 0 to about 12 percent tungsten, from about 0 to about 12 percent tantalum, from 0 to about 5 percent titanium, from 0 to about 7 percent rhenium, from 0 to about 6 percent ruthenium, from 0 to about 4 percent niobium, from 0 to about 0.2 percent carbon, from 0 to about 0.15 percent boron, from 0 to about 0.05 percent yttrium, from 0 to about 1.6 percent hafnium, balance nickel and incidental impurities. Specific compositions are known in the art. The turbine blade 20 and its airfoil are preferably as-cast structures, with an equiaxed, directionally oriented polycrystalline, or single-crystal structure. The airfoil 22 may be previously coated with a layer of a noble metal such as platinum, so that the final modified aluminide is a modified platinum aluminide.

A coating source is prepared, numeral 62. The coating source comprises the elements and/or compounds that enter the coating reaction. The coating source preferably comprises an aluminum halide and a fluoride of the modifying element as a source of the modifying element. The aluminum halide is preferably aluminum trifluoride ($AlF_3$), although aluminum trichloride or other operable source may also be used. The modifying element is zirconium, hafnium, or yttrium, or mixtures thereof. The tetrafluorides of these modifying elements are the preferred sources, although during the reactions other fluorides may be produced and could therefore also be used as starting material sources for the modifying elements. The respective preferred tetrafluorides are zirconium tetrafluoride ($ZrF_4$), hafnium tetrafluoride ($HfF_4$), or yttrium tetrafluoride ($YF_4$), or mixtures thereof. (The iodides of the modifying elements may be used in some circumstances, but the chlorides and bromides are unsuitable and may not be used.) All of these compounds are solids at room temperature.

The aluminum halide is preferably provided in a loose powdered form. The tetrafluoride of the modifying element may be in a loose powdered form separated from the surface to be processed, or in a powdered form in a binder applied to the surface as will be discussed later. The coating source may optionally contain, and preferably does contain, the elemental solid form of aluminum (or its alloys) and/or the elemental solid form of the modifying element (zirconium, hafnium, and/or yttrium, in pure or alloyed form). (As used in this context, naming the element includes the pure element and its alloys.) For definiteness, the balance of the discussion of the method will focus on deposition of zirconium from zirconium tetrafluoride, but the approach is similar for the other modifying elements or combinations of the modifying elements.

The concentration of the modifying element in the final protective layer 40 or 46 depends upon the relative concentration of the aluminum halide and the fluoride of the modifying element. In the case that has been most extensively studied, the aluminum halide is aluminum trifluoride and the fluoride of the modifying element is zirconium tetrafluoride. A weight ratio of aluminum trifluoride to zirconium tetrafluoride of about 1.4:1 produces a coating with about 1 percent by weight zirconium. A weight ratio of aluminum trifluoride to zirconium tetrafluoride of about 3:1 produces a coating with about 6 percent by weight zirconium. Intermediate and higher or lower amounts of zirconium may be produced with a ratio that is determined respectively by interpolation and extrapolation.

The coating source further includes a carrier gas that transports the other components of the coating source through the coating system. Argon gas is preferred as the carrier gas, but other gases such as hydrogen may be used in some circumstances.

Using the coating source, the protective coating is deposited onto the surface of the article, numeral 64. The deposition step 64 includes two substeps, contacting the coating source to the article, numeral 66, and heating the coating source and the article to a coating temperature of at least about 1850° F., more preferably from about 1850° F. to about 2000° F., and most preferably from about 1925° F. to about 1975° F., for a period of time sufficient to permit aluminum and the modifying element to coat onto the surface of the article, numeral 68. These substeps 66 and 68 are typically performed at least in part simultaneously, although some parts of the contacting substep 66 may be performed prior to the heating step 68 or vice versa.

Figure 4:
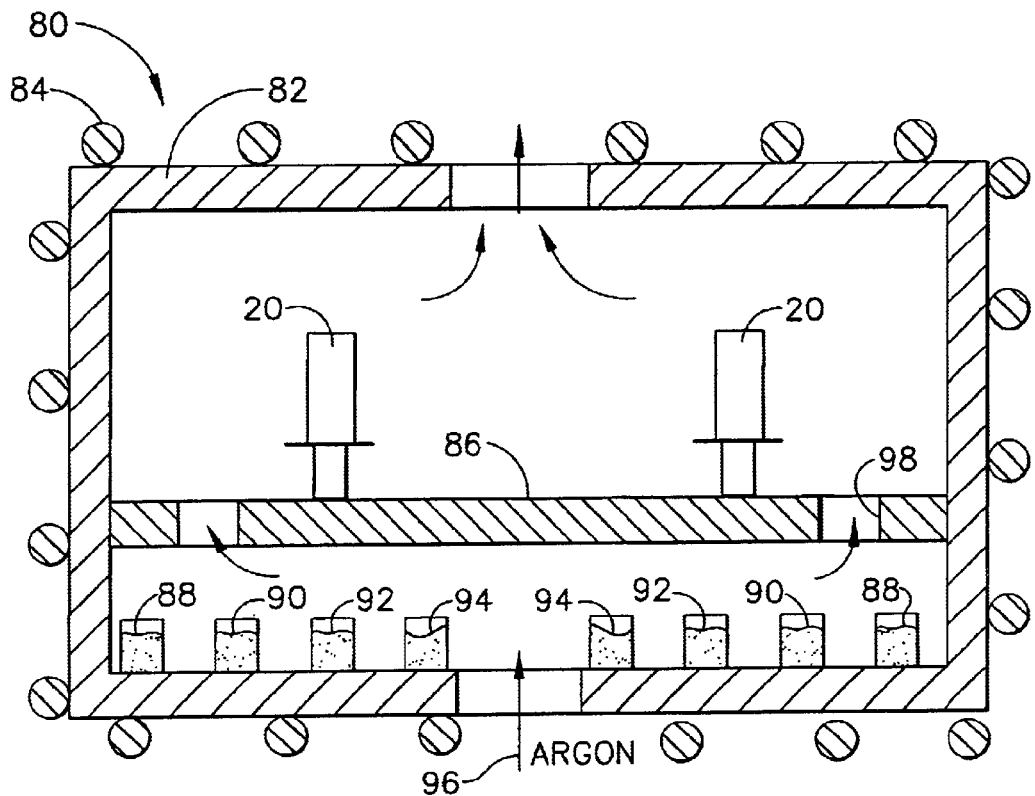
FIG. 4 is a schematic depiction of a first embodiment of a coating approach.
Figure 5:
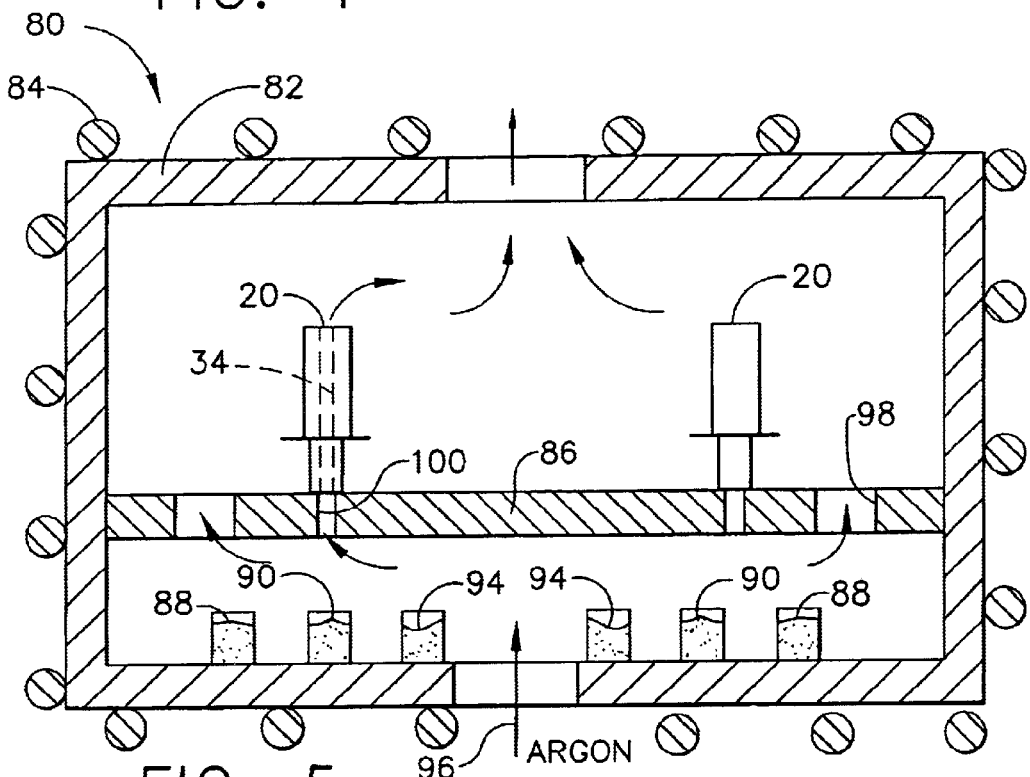
FIG. 5 is a schematic depiction of a second embodiment of a coating approach.

FIGS. 4–5 illustrate two variations of a coating apparatus that may be used in the deposition step 64. These two forms of the coating apparatus will be discussed by way of illustration of the approach, although other structures and types of coating apparatus may be used. In each case, a coating apparatus 80 includes a retort 82 that is externally heated, here by schematically indicated electrical resistance heating coils 84. The articles to be coated, here the turbine blades 20, are supported on a shelf 86 in the upper portion of the retort 82.

The solid components of the coating source are placed into the lower portion of the retort 82 in the embodiment of FIG. 4. The solid components are schematically indicated by containers 88 of aluminum trifluoride, containers 90 of aluminum metal, and for the case where the modifying element is zirconium, containers 92 of zirconium tetrafluoride and containers 94 of zirconium metal sponge or powder. Other containers would be provided for mixtures of the modifying elements. The various solid components need not be separated into separate containers, but instead may be mixed together. The embodiment of FIG. 5 is similar, except that the zirconium tetrafluoride is not provided separately from the turbine blade 20. Instead, the zirconium tetrafluoride powder is mixed with an organic binder and a carrier to form a paint slurry. The paint slurry is applied to the surface of the turbine blade 20 prior to insertion into the retort 82 and dried by evaporating the carrier. The zirconium tetrafluoride powder is in direct contact with the surface to be processed.

Upon heating of the retort 82 to the coating temperature, zirconium tetrafluoride sublimes (at about 1112° F.) and the aluminum trifluoride remains as a solid but produces aluminum trifluoride gas. The presence of the aluminum and zirconium metals in elemental form ensure an excess of these elements in the coating source. The aluminum reduces the zirconium tetrafluoride. A flow 96 of the carrier gas, here argon, transports the mixture of reactive gases from the lower portion of the retort 82 to the upper portion and the turbine blades 20 to be coated. As indicated in FIGS. 4–5, the flow of coating gas may be through openings 98 in the shelf 86 to reach and coat the external airfoil surfaces 38. As indicated in FIG. 5, the flow of coating gas may also or instead be through openings 100 in the shelf 86 that register with the internal passages 34 of the turbine blade 20, to reach and coat the internal airfoil surfaces 36. In both cases, the coating gas deposits aluminum and zirconium onto the exposed surfaces. Any unreacted coating gas is swept out of the retort 82 by the flow of the carrier gas. The coating process is continued as long as necessary to produce the desired thickness of the coatings 40 and 46.

At the elevated coating temperature of the deposition step 64, the deposited aluminum, modifying element, and any other co-deposited elements (as well as platinum, if present) interdiffuse with each other and with the metal of the substrate 42. The diffusion continues upon exposure to elevated temperatures in service. The resulting layers are therefore diffused into the surfaces upon which they are deposited, and with increasing diffusion time become less distinct as separate layers. FIG. 2 depicts the layers 40 and 46 as distinct layers for purposes of clarity in the illustration, but over time the interdiffused layers 40 and 46 become more like regions at the surfaces of the substrate 42.

Returning to the discussion of FIG. 3, upon completion of the deposition step 64, the ceramic thermal barrier coating 48 is optionally deposited over the external aluminide protective layer 46, numeral 70. The ceramic thermal barrier coating 48 may be deposited by any operable technique, such as physical vapor deposition or plasma spray.

The present invention has been reduced to practice using the approach discussed in relation to FIGS. 3 and 4 to deposit zirconium-modified aluminides and hafnium-modified aluminides. The substrate was Rene' N5, a nickel-base superalloy which has a nominal composition in weight percent of about 7.5 percent cobalt, about 7 percent chromium, about 6.2 percent aluminum, about 6.5 percent tantalum, about 5 percent tungsten, about 1.5 percent molybdenum, about 3 percent rhenium, about 0.05 percent carbon, about 0.004 percent boron, about 0.15 percent hafnium, up to about 0.01 percent yttrium, balance nickel and incidental impurities. The substrate 42 was coated with a zirconium-modified diffusion aluminide protective layer about 0.0023 inch thick. Zirconium compositions ranging from about 0.1 weight percent to about 6.8 weight percent were produced. In separate trials, hafnium-modified diffusion aluminide coatings were prepared. Other studies have indicated that the use of the zirconium-modified aluminide layer or the hafnium-modified aluminide layer increases the life of the coated article substantially as compared with the non-modified aluminide layer. Even further improvements are obtained by using a zirconium-modified platinum aluminide layer or the hafnium-modified platinum aluminide layer.

Although a particular embodiment of the invention has been described in detail for purposes of illustration, various modifications and enhancements may be made without departing form the spirit and scope of the invention. Accordingly, the invention is not to be limited as by the appended claims.

What is claimed is:

1. A method for coating an article, comprising the steps of:
   providing the article having a surface;
   preparing a coating source comprising:
      a solid aluminum halide,
      a solid fluoride or a solid iodide of a modifying element as a source of the modifying element, the modifying element being selected from the group consisting of zirconium, hafnium, and yttrium, and combinations thereof, and
      a carrier gas;
   producing a coating gas from the coating source, the coating gas comprising a gaseous aluminum halide, a gaseous fluoride or a gaseous iodide of the modifying element, and the carrier gas; and
   contacting the coating gas to the article; and simultaneously
   heating the coating gas and the article to a coating temperature of at least about 1850° F. for a period of time sufficient to permit aluminum and the modifying element to coat onto the surface of the article.

2. The method of claim 1, wherein the step of providing the article includes the step of
   providing the article with a platinum-enriched surface region thereon.

3. The method of claim 1, wherein the article is an airfoil made of a nickel-base superalloy.

4. The method of claim 1, wherein the aluminum halide is aluminum trifluoride.

5. The method of claim 1, wherein the fluoride of the modifying element is used, and the fluoride of the modifying element is a tetrafluoride of the modifying element.

6. The method of claim 1, wherein the coating source further includes elemental solid aluminum.

7. The method of claim 1, wherein the coating source further includes an elemental solid modifying element.

8. The method of claim 1, wherein the step of preparing the coating source includes the step of
   providing the solid fluoride or the solid iodide of the modifying element separated from the article surface.

9. The method of claim 1, wherein the step of preparing the coating source includes the step of
   providing the fluoride or the iodide of the modifying element applied directly to the article surface.

10. The method of claim 1, wherein the modifying element is zirconium.

11. The method of claim 1, wherein the modifying element is hafnium.

12. A method for coating an article, comprising the steps of:
    providing the article having a surface, the article being an airfoil;
    preparing a coating source comprising:
       a solid aluminum halide,
       a solid fluoride of a modifying element as a source of the modifying element, the fluoride of the modifying element being selected from the group consisting of a zirconium fluoride and a hafnium fluoride, and combinations thereof, and
       a carrier gas;
    producing a coating gas from the coating source, the coating gas comprising a gaseous aluminum halide, a gaseous fluoride of the modifying element, and the carrier gas; and
    contacting the coating gas to the surface of the airfoil; and simultaneously
    heating the coating gas and the article to a coating temperature of from about 1850° F. to about 2000° F. for a period of time sufficient to permit aluminum and the modifying element to coat onto the surface of the airfoil.

13. The method of claim 12, wherein the step of providing the article includes the step of
    providing the article with a platinum-enriched surface region thereon.

14. The method of claim 12, wherein the fluoride of the modifying element is zirconium tetrafluoride.

15. The method of claim 12, wherein the fluoride of the modifying element is hafnium tetrafluoride.

16. The method of claim 12, wherein the aluminum halide is aluminum trifluoride, the fluoride of the modifying element is zirconium tetrafluoride, and the weight ratio of aluminum trifluoride to zirconium tetrafluoride is from about 1.4:1 to about 3:1.

17. The method of claim 12, wherein the coating source further includes elemental solid aluminum.

18. The method of claim 12, wherein the coating source further includes an elemental solid modifying element.

19. The method of claim 12, wherein the step of preparing the coating source includes the step of
    providing the solid fluoride of the modifying element separated from the airfoil surface.

20. The method of claim 12, wherein the step of preparing the coating source includes the step of
    providing the flouride of the modifying element applied directly to the airfoil surface.

* * * * *

UNITED STATES PATENT AND TRADEMARK OFFICE
CERTIFICATE OF CORRECTION

PATENT NO.    : 6,863,925 B1
DATED         : March 8, 2005
INVENTOR(S)   : Wheat et al.

It is certified that error appears in the above-identified patent and that said Letters Patent is hereby corrected as shown below:

Column 7,
Line 11, "limited as" should be -- limited except as --.

Signed and Sealed this

Twenty-eighth Day of February, 2006

JON W. DUDAS
*Director of the United States Patent and Trademark Office*